United States Patent [19]
Harward

[11] Patent Number: 5,426,614
[45] Date of Patent: Jun. 20, 1995

[54] MEMORY CELL WITH PROGRAMMABLE ANTIFUSE TECHNOLOGY

[75] Inventor: Mark G. Harward, Dallas, Tex.

[73] Assignee: Texas Instruments Incorporated, Dallas, Tex.

[21] Appl. No.: 181,523

[22] Filed: Jan. 13, 1994

[51] Int. Cl.[6] .............................................. G11C 17/16
[52] U.S. Cl. ................... 365/225.7; 365/96; 365/156; 257/530
[58] Field of Search .................. 365/94, 95, 96, 225.7, 365/156; 257/530, 50

[56] References Cited

U.S. PATENT DOCUMENTS

| | | | |
|---|---|---|---|
| 4,524,377 | 6/1985 | Eguchi | 365/156 |
| 4,584,669 | 4/1986 | Moynihan et al. | 365/95 |
| 4,841,481 | 6/1989 | Ikeda et al. | 365/154 |
| 5,248,632 | 9/1993 | Tung et al. | 437/195 |
| 5,299,151 | 3/1994 | Ishihara et al. | 365/96 |

*Primary Examiner*—Joseph A. Popek
*Assistant Examiner*—Andrew Q. Tran
*Attorney, Agent, or Firm*—Jacqueline J. Garner; Richard L. Donaldson; William E. Hiller

[57] ABSTRACT

A memory cell (10) comprising a first antifuse (A1) operable to place the memory cell (10) in a non-volatile state. In one embodiment, the memory cell (10) comprises a pair of cross-coupled inverters (I1,I2). The first antifuse (A1) is connected between an output (B) of one of the cross-coupled inverters and ground and is operable to place the memory cell in a first non-volatile state. A second antifuse (A2) is connected between an output (B) and a supply voltage (Vcc) and is operable to place the memory cell (10) in a second non-volatile state. Only one of the antifuses, (A1 or A2) is programmed in memory cell (10).

17 Claims, 1 Drawing Sheet

MEMORY CELL WITH PROGRAMMABLE ANTIFUSE TECHNOLOGY

FIELD OF THE INVENTION

The invention relates generally to the field of nonvolatile memories and more specifically to memory cells with programmable antifuse technology.

BACKGROUND OF THE INVENTION

Semiconductor memories may be divided into two classes, volatile and nonvolatile. In volatile memories the stored data is lost when power is removed, and in non-volatile memories the stored data is not lost when power is lost. Because of the need for static non-volatile memory in calculators, watches, game products, and other commercial devices, there has been a increasing demand for these type of memories. Typical non-volatile memories include Read-Only Memories (ROMs), Erasable Programmable Read-Only Memories (EPROMs), Flash EPROMs, and Electrically Erasable Programmable Read-Only Memories (EEPROMs). In a ROM, the contents are defined at the time of fabrication by selective patterning of one or more fabricated layers. However, a ROM cannot be rewritten if the user wants to modify the data stored in the ROM. Rather the user must re-specify the desired memory contents and the revised chips must be fabricated with new information stored. Erasable Programmable Read Only Memories (EPROM) are erased by exposing the memory array to ultraviolet light which allow the charge stored on a Floating Gate Avalanche Injection Metal Oxide Semiconductor (FAMOS) device floating gate to discharge to the surrounding conductive materials, thereby erasing the state of the cell. To rewrite the memory, an elevated voltage supply is required to tunnel charge to the desired FAMOS floating gates. The drawbacks of EPROMs include long erase times (~20 minutes), expensive windowed packaging, process complications due to the high programming voltage required, and the fact that EPROMS must be removed from the system to be re-configured.

Electrically Erasable Programmable Read Only Memories (EEPROM) are electrically erasable by the application of an elevated voltage which overwrites the charge on the floating gate of the FAMOS device. This has obvious advantages over the EEPROM technology in that devices can be quickly erased while still in the system and can be purchased in inexpensive plastic packages. EEPROMs have the disadvantage of requiring the system designer to route the elevated programming voltage as well as the normal supply voltage to their design. The erasing is typically done in large blocks, so while prototyping the user must completely reload the memory contents when any change is made.

Flash technology is the latest successful entrant into the non-volatile memory business. Flash memories are similar to EEPROMs except that the erasing voltage is the same as the normal power supply. Again, the erasing is typically done in large blocks, so while prototyping the user must completely reload the memory contents when any change is made.

SUMMARY OF THE INVENTION

A memory cell comprising a first programmable antifuse operable to place the memory cell in a non-volatile state is disclosed. In one embodiment, the memory cell comprises a pair of cross-coupled inverters. The first programmable antifuse is connected between an output of a first one of the cross-coupled inverters and a ground node. The first programmable antifuse is operable to place the memory cell in a first non-volatile state, such as a logic "1". A second programmable antifuse is connected between an output of a second one of the pair of cross-coupled inverters and the ground node. The second programmable antifuse is operable to place the memory cell in a second non-volatile state, such as a logic "0".

An advantage of the invention is providing a memory cell with programmable antifuse technology such that it is initially very easily re-writeable volatile memory which may subsequently be made non-volatile. A volatile memory is useful during the development phase of the system which the memory is in. Once the system has been debugged and the system specification is finalized, the memory may be made non-volatile and read-only by programming the appropriate antifuse. Useful applications include circuits such as microprocessor microcode and BIOS instruction chips.

These and other advantages will be apparent to those of ordinary skill in the art upon reference to the specification in conjunction with the drawings and claims.

BRIEF DESCRIPTION OF THE DRAWINGS

In the drawings.

Corresponding numerals and symbols in the different figures refer to corresponding parts unless otherwise indicated.

DETAILED DESCRIPTION OF THE INVENTION

The preferred embodiments of the invention will now be described in conjunction with several CMOS memory cell configurations. It will be apparent to those skilled in the art that the invention may be applied to devices such as SRAMs (Static Random Access Memories), shift registers, sequentially accessible memories and other random access memories, which may each realize the benefits thereof.

The preferred embodiments of the invention allow the system designer to use a memory system in their design which can be treated exactly like a standard READ/WRITE Random Access Memory (RAM) during system development. The chips operate as a normal SRAM until the user decides to permanently configure the stored data and change the chip to a non-volatile ROM (Read Only Memory). After this, the Read operation still is performed as a standard SRAM (Static Random Access Memory), but writing new and different data is not possible.

This avoids the erasing step required with prior art non-volatile memory technologies. It would then be very convenient to implement the final SRAM contents in a non-volatile Read Only Memory once the final contents of the SRAM is decided upon. Although this invention is one-time-programmable once the decision is made to make the SRAM contents non-volatile, this is consistent with the majority of system requirements which consume most of the non-volatile memory. It is noted that much of the EPROM market is satisfied with low-cost window-less plastic packages which make the EPROMs one time programmable. This is acceptable once the final system specification is completed.

Figure 1:
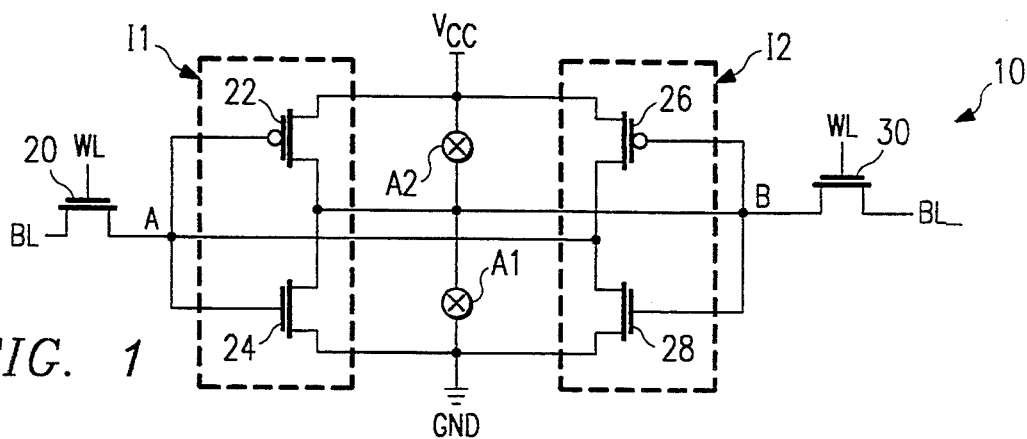
FIG. 1 is a schematic diagram of a six transistor memory cell with programmable antifuse technology according to the first preferred embodiment of the invention.

A first preferred embodiment of the invention is shown in FIG. 1. The memory cell 10 of FIG. 1 is similar to prior art SRAM memory cells in that it comprises two cross-coupled inverters, I1 and I2, and two pass transistors, 20 and 30. Each of the inverters I1 and I2 comprise a p-channel transistor (22, 26) connected between Vcc and an output node (B,A) and an n-channel transistor (24, 28) connected between the output node (B,A) and ground. Pass transistor 20 is connected between a bitline BL and the input to inverter I1. Pass transistor 30 is connected between a bitline BL__ and the input to inverter I2. The gates of pass transistors 20 and 30 are connected to a wordline signal WL. The memory cell 10 of FIG. 1 is different from prior art SRAMs in that it contains an antifuse A1 connected between the output of inverter I1 and ground and antifuse A2 connected between the output of inverter I1 and Vcc. The antifuses are normally open devices which would not influence normal memory cell operation except for a small amount of additional capacitance and depending on the antifuse technology employed, a small amount of leakage current through the antifuses which the transistors could be sized to supply. Methods for forming antifuses are well known in the art.

Figure 2:
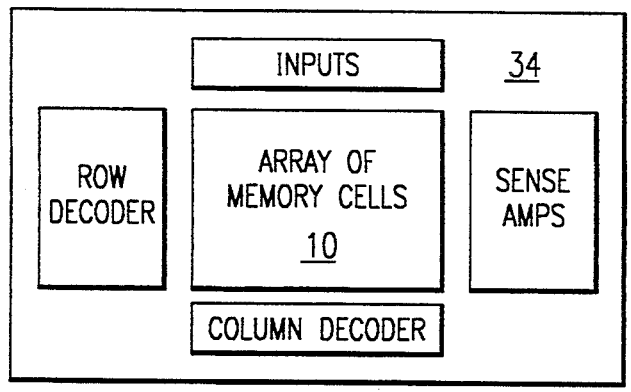
FIG. 2 is a block diagram of an memory array device according to the preferred embodiments of the invention.

Referring to FIG. 2, many memory cells 10 of FIG. 1 may be combined to form a memory array such as in SRAM 34. SRAM 34 may then be placed in a system which may be under development. In the development phase of operation, the memory cell 10 of FIG. 1 would operate like a typical SRAM cell. The value stored in cell 10 could be changed at any time and would be lost during a power down condition. Then, when the design of a system is finalized, the cell 10 could be made non-volatile or fixed by blowing either antifuse A1 or A2. If antifuse A1 were blown, the cell 10 would permanently store a logic value of "1". If antifuse A2 were blown, the cell 10 would permanently store a value of "0". Antifuse A1 may be blown by providing a high voltage on both BL__ and WL. In addition, a low voltage is provided on BL so that current does not shunt from node A to ground through transistor 28. The voltage applied to BL__ (minus some threshold drop across pass transistor 30) is applied to node B and will thus be applied across the terminals of antifuse A1. If the voltage is high enough, the antifuse is blown. Node B is thus connected to GND, transistor 28 is turned off and transistor 26 is turned on. Node A is accordingly high and the cell has a stored value of '1'. Alternatively, antifuse A2 may be programmed by placing a high voltage on WL, a low voltage on BL__ and raising Vcc until the voltage across the terminals of antifuse A2 is large enough to program antifuse A2. Once antifuse A2 is programmed, node B is connected to Vcc turning transistor 28 on and transistor 26 off. Node A is accordingly at a low voltage and a "0" is stored in the Cells 10. It should be noted that only one of the antifuses, A1 or A2, is programmed. The voltage required to program the antifuses will depend on the design and technology of the antifuse and on the transistor characteristics. Typical voltages are in the range of 10 to 20 volts, depending on the antifuse technology used. Emerging antifuse technologies may provide even lower programming voltages. Programming some antifuse technologies, such as that taught by U.S. Pat. No. 4,899,205 assigned to Actel which use a time-dependent-dielectric-breakdown mechanism may require the voltage to be held high for durations in the milli-second range. Other antifuses, such a amorphous silicon may take microsecond range pulse durations.

Figure 3:
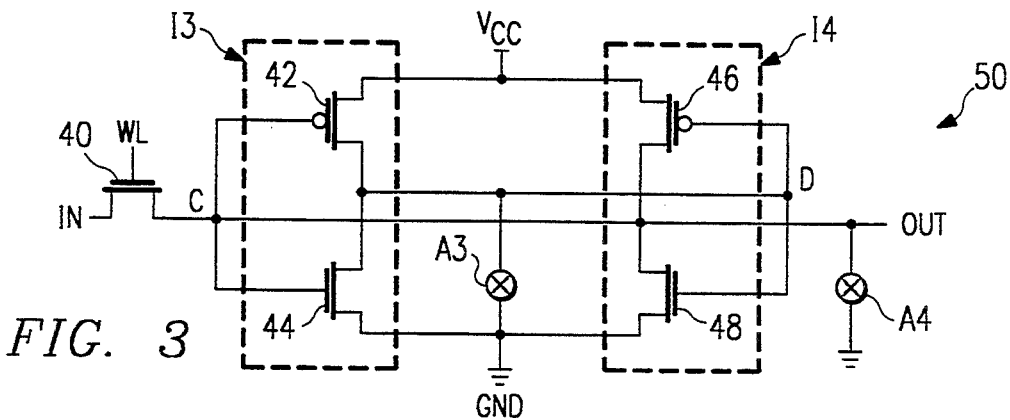
FIG. 3 is a schematic diagram of a five transistor memory cell with programmable antifuse technology according to the second preferred embodiment of the invention.

A second preferred embodiment is shown in FIG. 3. Memory cell 50 is similar to a typical five transistor memory storage cell in that it comprises cross-coupled inverters I3 and I4 and pass transistor 40. As in the above case, each inverter I3 and I4 includes a p-channel transistor (42,46) connected between Vcc and an output node (D,C) of the respective inverter (I3,I4). Pass transistor 40 is connected between a memory cell input IN and node C. Node C is also the output node OUT of the memory cell 50. Cell 50 is different from prior art structures in that it contains antifuse A3 connected between node D and ground and antifuse A4 connected between node C and ground.

In operation, a number of cells 50 may be combined to form a memory device such as the SRAM 34 shown in FIG. 2. As in the first preferred embodiment, memory cell 50 operates as a typical memory cell during the development stage of a system. Once the design is finalized, one of the antifuses A3 or A4 is programmed to permanently stored the desired value. Antifuse A3 is programmed if a high output is desired and antifuse A4 is programmed if a low output is desired. Still referring to FIG. 3, Antifuse A3 may be programmed by placing a low voltage on IN, and high voltage on WL which turns on p-channel transistor 42 and raising Vcc in order to provide a wide voltage differential across the terminals of antifuse A3. Antifuse A3 is thus programmed providing a connection between node D and ground. This, in turn, causes the output OUT to be permanently high as p-channel transistor 46 is held on, pulling node OUT up to Vcc. Antifuse A4 may be programmed by placing a high voltage on IN and WL. The voltage differential between node C and ground and thus across the terminals of antifuse A4 is large enough to program the antifuse A4 to provide a connection between node C (OUT) and ground.

Figure 4:
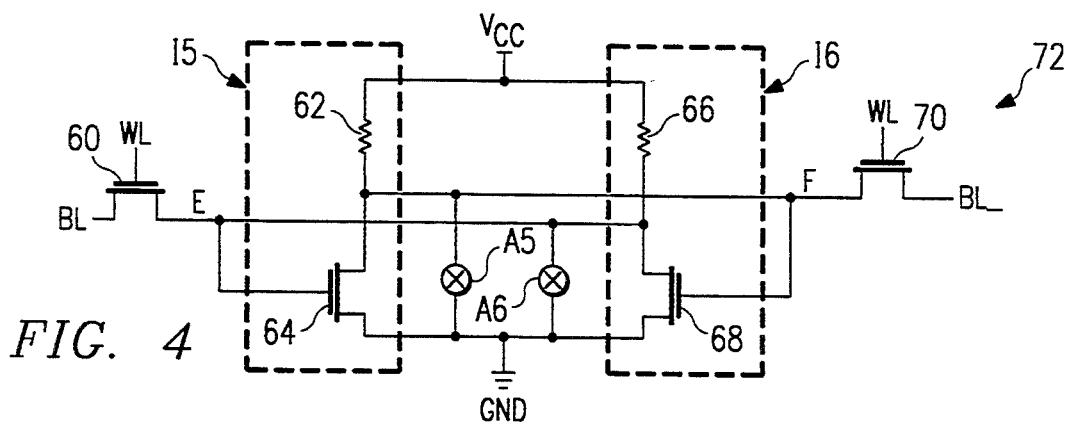
FIG. 4 is a schematic diagram of a four transistor two resistor memory cell with programmable antifuse technology according to the third preferred embodiment of the invention.

A third preferred embodiment is shown in FIG. 4. Cell 72 is similar to prior art four transistor - two resistor SRAM cells except that antifuses A5 and A6 have been added. Cell 72 contains resistors 62 and 66 connected between Vcc and nodes F and E, respectively. N-channel transistors 64 and 68 are connected between GND and nodes F and E, respectively. Pass transistor 60 is connected between node E and BL and pass transistor 70 is connected between node F and BL__. The gates of pass transistors 60 and 70 are connected to WL. Antifuse A5 is connected between node F and GND and may be used to store a "1" in cell 72. Antifuse A5 may be programmed by placing a high voltage on BL__ and WL and a low voltage on BL. Antifuse A6 is connected between node E and GND and may be used to store a "0" in cell 72. Antifuse A6 may be programmed by placing a high voltage on BL and WL and a low voltage on BL__.

While this invention has been described with reference to illustrative embodiments, this description is not intended to be construed in a limiting sense. Various modifications and combinations of the illustrative embodiments, as well as other embodiments of the invention, will be apparent to persons skilled in the art upon references to the description. It is therefore intended that the appended claims encompass any such modifications or embodiments.

What is claimed is:

1. A memory cell comprising a first programmable antifuse operable to place said memory cell in a non-volatile state and a pair of cross-coupled inverters, wherein said first programmable antifuse is connected between an output of a first one of said pair of cross-coupled inverters and a ground node.

2. The memory cell of claim 1, further comprising:
   a. a second programmable antifuse connected between an output of second one of said pair of cross-coupled inverters and said ground node.

3. The memory cell of claim 1, further comprising:
   a. a second programmable antifuse connected between said output of said first one of said pair of cross-coupled inverters and a supply voltage.

4. The memory cell of claim 1, wherein each of said pair of cross-coupled inverters comprises a p-channel transistor and an n-channel transistor connected in series between a supply voltage and said ground node.

5. The memory cell of claim 1, wherein each of said pair of cross-coupled inverters comprises a resistor and an n-channel transistor connected in series between a supply voltage and said ground node.

6. A memory device comprising a plurality of memory cells, each of said memory cells comprising:
   a. a pair of cross-coupled inverters; and
   b. a first programmable antifuse connected between a first output node of said pair of cross-coupled inverters and a ground node.

7. The memory device of claim 6, further comprising, for each of said memory cells, a second programmable antifuse connected between a second output node of said pair of cross-coupled inverters and said ground node.

8. The memory device of claim 6, further comprising, for each of said memory cells, a second programmable antifuse connected between said first output node and a supply voltage.

9. The memory device of claim 6, wherein each of said pair of cross-coupled inverters comprises a p-channel transistor and an n-channel transistor connected in series between a supply voltage and said ground node.

10. The memory device of claim 6, wherein each of said pair of cross-coupled inverters comprises a resistor and an n-channel transistor connected in series between a supply voltage and said ground node.

11. A method of forming a memory device, comprising the steps of:
   a. providing a plurality of memory cells each comprising a pair of cross-coupled inverters having first and second output nodes;
   b. providing, for each of said plurality of memory cells, a first antifuse connected between said first output node of each of said plurality of memory cells and a ground node;
   c. programming said first antifuse in at least one first memory cell of said plurality of memory cells to convert said at least one first memory cell from a volatile memory cell to a non-volatile memory cell.

12. The method of claim 11, wherein said step of programming said first antifuse comprises the step of providing a programming voltage to said first output node of said at least one first memory cell through a first bitline.

13. The method of claim 12, further comprising the step of grounding said second output node of said at least one first memory cell through a second bitline.

14. The method of claim 11, further comprising the steps of:
   a. providing, for each of said plurality of memory cells, a second antifuse connected between said second output node of each of said plurality of memory cells and said ground node; and
   b. programming said second antifuse in at least one second memory cell of said plurality of memory cells by providing a programming voltage to said second output node of said at least one second memory cell to convert said memory device from a volatile memory device to a non-volatile memory device.

15. The method of claim 14, wherein said step of programming said second antifuse comprises the steps of:
   a. providing said programming voltage to said second output node of said at least one second memory cell through a first pass transistor and a first bitline; and
   b. grounding said first output node of said at least one second memory cell through a second pass transistor and a second bitline.

16. The method of claim 14, wherein said step of programming said second antifuse comprises the steps of:
   a. grounding said first output node of said at least one second memory cell through a first bitline; and
   b. providing said programming voltage to said second output node of said at least one second memory cell.

17. The method of claim 11, further comprising the steps of:
   a. providing a second antifuse for each of said plurality of memory cells, said second antifuse connected between said first output node of each of said plurality of memory cells and a supply voltage; and
   b. programming said second antifuse in at least one second memory cell by grounding said first output node and raising the supply voltage.

* * * * *